Oct. 26, 1965 G. A. BALDAUF ET AL 3,214,381
BARIUM OXIDE MOISTURE GETTER PREPARATION
Filed Dec. 5, 1962
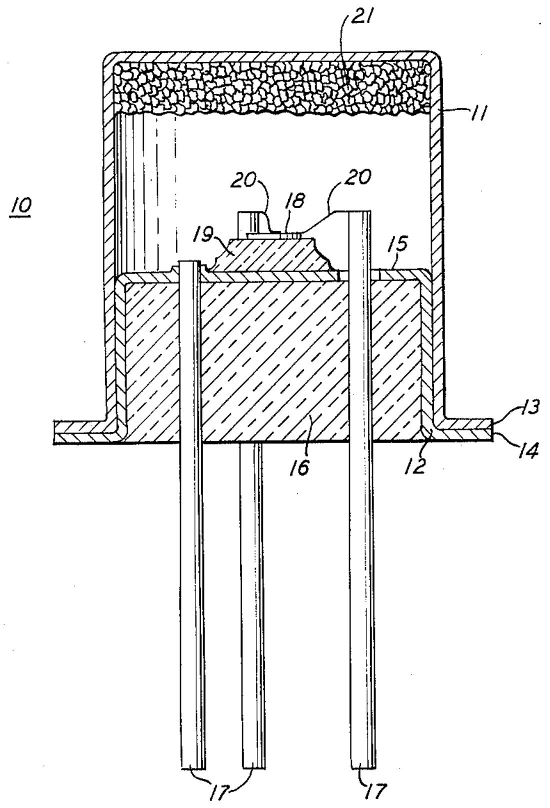
INVENTORS G. A. BALDAUF
M. J. ELKIND
BY Edward M. Fink
ATTORNEY United States Patent Office 3,214,381

Patented Oct. 26, 1965

3,214,381
BARIUM OXIDE MOISTURE GETTER PREPARATION

Gerard A. Baldauf, Wernersville, and Michael J. Elkind, Wyomissing, Pa., assignors to Bell Telephone Laboratories, Incorporated, New York, N.Y., a corporation of New York Filed Dec. 5, 1962, Ser. No. 242,550
6 Claims. (Cl. 252—181.7)

This invention relates to a method for the preparation of a barium oxide moisture getter which is of interest for use in encapsulated semiconductor devices and to the devices so produced.

It is well known that the nature and content of the atmosphere surrounding a semiconductor body, such as a transistor or diode, can affect certain of its electrical characteristics. More specifically, it is known that water vapor, even in trace amounts, adversely affects the long term electrical characteristics of semiconductor devices, particularly transistors.

As a consequence, there has developed in the art a variety of arrangements for encapsulating semiconductor devices ranging from special surface coatings and the like to rather widely used metal and glass or ceramic envelopes which may be exhausted to a high degree or filled with controlled atmospheres. Moreover, it is known to include within the latter envelopes desiccants, such as powdered glass or silica gel for inhibiting the deleterious affects of water vapor.

Recently, there was described in U.S. Patent No. 3,083,320, granted March 26, 1963, semiconductor devices wherein there is provided within the envelope enclosing the device a highly efficient agent for gettering deleterious materials by chemisorbency during the extended life of the device, such agent comprising a mixture of barium and strontium oxides impregnated upon a porous metal matrix. Although this getter is highly efficient, recent studies have shown that the matrix used to support the oxides is capable of shedding metallic particles within the device enclosure when mechanically agitated, so resulting in the formation of conducting media across device junctions.

In accordance with the present invention, a technique is described for preparing a barium oxide moisture getter which is destined for use within the envelope enclosing semiconductor devices. More specifically, the inventive technique involves adding a particulate porous metal to a preheated solution of barium hydroxide, separating the particles and drying, pelletizing and sintering the resultant material, thereby resulting in a moisture getter having a higher activity and more uniform distribution of gettering material than heretofore obtained.

The invention will be more readily understood from the following detailed description taken in conjunction with the drawing wherein:

The figure is a cross-sectional illustration of a typical encapsulated semiconductor device.

In the figure there is shown a transistor 10 encapsulated in an air-tight hermetically sealed envelope. The envelope comprises two basic parts, a metal can 11 and a header assembly 12 which are joined together by conventional welding techniques, either hot or cold, along a pair of flanges 13 and 14. The header assembly 12 typically includes a metal cap 15 with an insulating glass insert 16 for supporting a number of metal leads 17 which are the terminals of the device. The semiconductor wafer 18 is mounted on a platform 19, in turn, supported on the header assembly. Fine wire leads 20 are joined to the electrode areas on the semiconductor wafer 18 and attached to their respective terminal leads 17.

Thus, the transistor element, which typically is of the diffused junction type having a plurality of conductivity type regions defining p-n junctions therebetween is exposed to the ambient atmosphere within the sealed envelope. Customarily, the device assembly is subjected to a rigid cleaning and drying procedure before the final sealing operation which joins the can 11 to the header assembly 12. However, despite precautionary measures, a small residue of contaminants, primarily water vapor, remains within the envelope after sealing.

In accordance with this invention, there is placed within the metallic can 11 an element 21 composed of a porous metallic matrix which has been coated with barium oxide produced by decomposition of barium hydroxide. As shown in the drawing, the gettering element 21 is in the form of a disc. This element 21 may be conveniently secured within the housing by any of several techniques, one of the most advantageous being to coat one face of the gettering element 21 lightly with an evaporated metal, such as gold. The disc may then be brazed into the top of the can 11 by heating, typically at 950° C. in a hydrogen atmosphere using a gold, gold-copper, or gold-nickel brazing alloy and a nickel or Kovar can. The disc may also be secured within the housing by other methods such as by clips welded to the walls of the can 11 or by other expedients.

The gettering element 21 is advantageously fabricated in accordance with the following procedure. While the invention is described largely in terms of nickel matrices, it will be appreciated by those skilled in the art that metals such as copper or alloys such as nickel-cobalt alloy, bronze, etc. may be utilized. In general, it may be stated that any sinterable metal or alloy having a melting point greater than 1000° C. is suitable in this use. Further, it will be understood that porous insulating ceramic bodies coated with barium hydroxide by solution impregnation may be substituted for the metallic matrices.

The starting material is desirably as pure as practical in order to avoid contamination of the device surfaces and to preclude the possibility of deleterious chemical reactions which might tend to compete with the moisture gettering activity of the barium oxide.

Carbonyl nickel powder obtained from commercial sources has been found suitable in this use. Although the particle size of the nickel powder is not critical, in most uses, a general preference exists for particles having a mesh size within the range of 100 to 140, such particles being satisfactory for obtaining a porosity of 40 to 50 microns, which allows absorption of moisture by barium oxide.

The barium hydroxide employed is of reagent grade and obtainable from commercial sources. It has been found that the maximum amount of barium oxide is obtainable from a barium hydroxide solution having a concentration of barium oxide within the range of 24% to 48.6% by weight of the total solution. The use of concentrations appreciably less than the indicated minimum fails to produce a getter having the degree of activity for absorbing moisture as is required in commercial devices. The use of barium oxide concentrations greater than the noted maximum tends to result in the formation of an insulating layer of barium hydroxide on the nickel particles, such layer hindering proper sintering. Studies have revealed that the use of barium oxide concentrations of approximately 42.5% by weight are advantageous in several respects, the most important being the production of a maximum amount of barium oxide distributed uniformly throughout the nickel matrix.

The following is an outline of the procedure to be followed in producing a moisture getter from the above materials:

Approximately 130 grams of barium hydroxide octahydrate and 20 grams of water are added to a beaker and heated to a temperature within the range of 85–90° C. for a time sufficient to assure total solution. Next, a suitable quantity of carbonyl nickel powder, typically 10–15 grams is slowly added to the preheated barium hydroxide, while stirring by mechanical means in order to avoid the formation of a crust on the nickel particles. After stirring the mixture for several minutes, typically five, the excess barium hydroxide is separated from the nickel particles mechanically.

Following, the barium hydroxide coated nickel particles are heated to dryness with continual stirring, drying being attained in about 5–10 minutes. In order to assure the removal of as much water of hydration as possible the coated particles are then further dried by heating in an oven maintained at approximately 200° C. for a duration within the range of one to two hours.

The dried particles are now broken up into a fine powder in any conventional milling apparatus. It will be understood that extensive milling is undesirable since the nickel may be stripped of its barium hydroxide coating.

The next step in the procedure involves taking a selected quantity of the coated powder and placing it in a die mounted in any commercially-available hydraulic press which can be preset so as to result in a compression ratio of approximately 55%, that is, a ratio such that the volume of pellet to volume of powder is 55%. It has been determined that a compression ratio of 55% is satisfactory for obtaining optimum mechanical stability (green strength) without affecting the activity. Typically, pressures of the order of 5000 pounds per square inch are applied, so yielding a barium hydroxide coated nickel pellet.

The pellet so produced is now inserted in a boat constructed of a noncontaminating material such as Driver Harris No. 499 nickel which is a high purity passive nickel. The boat is then inserted in a suitable furnace and fired in the presence of an inert gas such as purified, dry, oxygen-free hydrogen containing less than 0.001% of impurities for a period of about 30–60 minutes at temperatures within the range of 900–1100° C. Any inert gas such as prepurified nitrogen or a mixture of 85% nitrogen and 15% hydrogen (forming gas) may be substituted for the hydrogen providing its impurity content is not undesirable. Firing at temperatures appreciably below the 900° C. minimum results in erratic activation, that is, nonuniform conversion of the barium hydroxide to the oxide form. The upper limit of 1100° C. is not absolute in nature and is dictated solely by considerations of the melting point of the matrix material, in the case described nickel (melting point 1453° C.).

Immediately after activation, the pellets are brazed into the device cans in the manner described above. However, if it is desired not to assemble the gettering element immediately into a semiconductor device envelope, the element should advantageously be stored in a desiccator or under vacuum to prevent contamination.

Several examples of the present invention are described in detail below. They are intended to be merely illustrative in nature and are not to be construed as limiting.

EXAMPLE I 122.5 grams of barium hydroxide octahydrate plus the required amount of water were inserted in a beaker and heated to a temperature of 90° C. The solution had the following composition: $7[Ba(OH)_2 \cdot 8H_2O]:H_2O$ (42.5% BaO). Next, 10 grams of carbonyl nickel having a particle size range of 100–140 mesh were added with stirring to the barium hydroxide solution, stirring being continued for 5 minutes. Then, the excess barium hydroxide solution was poured off and while stirring, the wet particles were heated at 100° C. until the mixture was dry. Further drying was then attained by heating the particles at 200° C. for one hour in an oven.

Following drying, the particles were broken up into a fine powder. Then, 20 pellets of coated nickel were obtained by taking 65 milligram samples of the dried particles and pressing each at a pressure of 5000 pounds per square inch in a die preset for obtaining a compression ratio of 55%.

After pressing, the pellets were inserted in a boat constructed of Driver Harris No. 499 nickel and fired in a furnace in the presence of dry hydrogen at 1100° C. for 30 minutes. The gettering elements so produced were then stored in a desiccator under vacuum.

EXAMPLE II

The procedure of Example I was repeated with the substitution of barium hydroxide having a barium oxide concentration of 48.6% by weight and carbonyl nickel having a particle size range of 100–140 mesh.

For comparative purposes prior art moisture getters were prepared by impregnating carbonyl nickel powder having a particle size range of 100 to 140 mesh with a mixture comprising 23% by weight $Ba(CO_3)$, 17% by weight $Sr(CO_3)$, 56% by weight amyl acetate and 4% by weight nitrocellulose solution by conventional techniques as described in the U.S. Patent 3,083,320 alluded to above. The samples so produced were compared for the degree of moisture gettering ability by the following procedure:

Device cans containing the moisture getters of the type described were inserted in a convenient size Teflon insulating block having predrilled holes capable of accommodating the device enclosures. At the bottom extremity of each hole provision was made for the entry of a thermocouple so that upon insertion the device can was in physical contact with the thermocouple. An initial temperature reading was then recorded and a measured quantity of water added to the can by means of a syringe in a manner such that adherence of the liquid to the walls of the can was avoided. The highest reading as a result of the exothermic hydration reaction was then noted on the temperature indicating instrument and the degree of activity determined by the difference between the initial and final readings. The results of these tests are tabulated below in Table I.

*Table I*

| Example | Impregnant | Ni Mesh Size | Degree of Activation | |
|---|---|---|---|---|
| | | | Average Increase, ° F. | Range, ° F. |
| 1 | Mixed Barium and Strontium Carbonate. | 100 and below. | 7 | 2-11 |
| 2 | Ba $(OH)_2$ Solution | do | 38 | 11-53 |
| 3 | Mixed Barium and Strontium Carbonate. | Less than 140. | 14 | 7-23 |
| 4 | $Ba(OH)_2$ Solution | do | 60 | 46-73 |

It is clearly evident by reference to the table that the barium oxide moisture getters prepared in accordance with the present inventive technique are superior to those of the prior art by several orders of magnitude.

While the invention has been described in detail in the foregoing explanation, the aforesaid is by way of illustration only and is not restrictive in character. The several modifications which will readily suggest themselves to persons skilled in the art are all considered within the scope of this invention, reference being had to the appended claims.

What is claimed is:

1. A method for the preparation of a gettering element which comprises the steps of adding a metallic matrix material having a melting point greater than 1000° C. to a hot aqueous solution of barium hydroxide having a barium oxide concentration within the range of 24–48.6% by weight, stirring the resultant mixture and mechanically separating said matrix material from the said solution, whereby there is produced a barium hydroxide coated material, drying, pressing and activating the said coated material in the presence of a dry inert gas at temperatures within the range of 900–1100° C., thereby converting the barium hydroxide to barium oxide.

2. The method in accordance with the procedure of claim 1 wherein the said matrix material is powdered nickel.

3. The method according to the procedure of claim 2 wherein said nickel has a particle size greater than 140 mesh.

4. The method in accordance with the procedure of claim 2 wherein said barium hydroxide solution has a barium oxide concentration of 42.5% by weight.

5. The method in accordance with the procedure of claim 2 wherein the said nickel is pressed to a compression ratio of 55%.

6. The method in accordance with the procedure of claim 2 wherein activation occurs in the presence of dry hydrogen.

References Cited by the Examiner

UNITED STATES PATENTS

| | | | |
|---|---|---|---|
| 3,056,074 | 9/62 | Fahey et al. | 317—234 |
| 3,083,320 | 3/63 | Godfrey et al. | 317—234 |

MAURICE A. BRINDISI, *Primary Examiner.*